United States Patent
Lam et al.

(10) Patent No.: US 11,302,866 B2
(45) Date of Patent: Apr. 12, 2022

(54) METHOD OF MANUFACTURING PHASE CHANGE MEMORY AND PHASE CHANGE MEMORY

(71) Applicants: Jiangsu Advanced Memory Technology Co., Ltd., Jiangsu (CN); Jiangsu Advanced Memory Semiconductor Co., Ltd., Jiangsu (CN)

(72) Inventors: Chung-Hon Lam, Hsinchu County (TW); Yu Zhu, Hsinchu County (TW); Kuo-Feng Lo, Hsinchu County (TW)

(73) Assignees: Jiangsu Advanced Memory Technology Co., Ltd., Jiangsu (CN); Jiangsu Advanced Memory Semiconductor Co., Ltd., Jiangsu (CN)

( * ) Notice: Subject to any disclaimer, the term of this patent is extended or adjusted under 35 U.S.C. 154(b) by 0 days.

(21) Appl. No.: 16/935,209

(22) Filed: Jul. 22, 2020

(65) Prior Publication Data
US 2021/0376237 A1     Dec. 2, 2021

(30) Foreign Application Priority Data
May 29, 2020   (CN) .......................... 202010477856.3

(51) Int. Cl.
*H01L 45/00*     (2006.01)
*H01L 27/24*     (2006.01)

(52) U.S. Cl.
CPC ...... *H01L 45/1675* (2013.01); *H01L 27/2409* (2013.01); *H01L 27/2463* (2013.01); *H01L 45/06* (2013.01); *H01L 45/1233* (2013.01); *H01L 45/1253* (2013.01); *H01L 45/1641* (2013.01)

(58) Field of Classification Search
CPC .................. H01L 45/1641; H01L 45/1675
See application file for complete search history.

(56) References Cited

U.S. PATENT DOCUMENTS

| | | | |
|---|---|---|---|
| 2014/0322884 A1* | 10/2014 | Higuchi | H01L 45/1233 438/382 |
| 2021/0104668 A1* | 4/2021 | Kim | H01L 27/2409 |
| 2021/0167130 A1* | 6/2021 | Park | H01L 45/1691 |

\* cited by examiner

*Primary Examiner* — Mounir S Amer
(74) *Attorney, Agent, or Firm* — CKC & Partners Co., LLC (57) ABSTRACT

A method of manufacturing a phase change memory includes: forming a stacked structure including a conductive layer, a lower electrode layer over the conductive layer, an upper electrode layer, a phase change material between the lower and upper electrode layers, and a selector material between the conductive layer and the lower electrode layer; etching the upper electrode layer to form an upper electrode wire; etching the phase change material according to the upper electrode wire to form a phase change material layer and expose a portion of the lower electrode layer, wherein the phase change material layer has an exposed side surface; after etching the phase change material, performing a nitridizing treatment on the side surface of the phase change material layer to form a nitridized phase change material layer covering the same; and etching the lower electrode layer, the selector material and the conductive layer.

10 Claims, 9 Drawing Sheets

METHOD OF MANUFACTURING PHASE CHANGE MEMORY AND PHASE CHANGE MEMORY

CROSS-REFERENCE TO RELATED APPLICATION

This application claims priority to China Application Serial Number 202010477856.3, filed May 29, 2020, which is herein incorporated by reference.

BACKGROUND

Field of Invention

The present invention relates to a method of manufacturing a phase change memory and a phase change memory.

Description of Related Art

Electronic products (e.g., mobile phones, tablets, and digital cameras) often have memory elements that store data. Conventional memory elements can store information through storage nodes of memory cells. Among them, the phase change memory uses resistance states (e.g., high resistance and low resistance) of the memory element to store information. The memory element may have a material that can be switched between different phase states (e.g., a crystalline phase and an amorphous phase). The different phase states enable the memory cell to have different resistance states for representing different values of stored data.

Generally, the phase change memory includes an upper electrode, a lower electrode, and a phase change material layer between the upper electrode and the lower electrode. Lithography and etching processes are commonly used to manufacture the phase change memory.

SUMMARY

The present invention provides a method of manufacturing a phase change memory, which includes: forming a stacked structure, the stacked structure including a conductive layer; a lower electrode layer disposed over the conductive layer; an upper electrode layer disposed over the lower electrode layer; a phase change material disposed between the lower electrode layer and the upper electrode layer; and a selector material disposed between the conductive layer and the lower electrode layer; etching the upper electrode layer according to a first mask to form an upper electrode wire; etching the phase change material according to the upper electrode wire to form a phase change material layer beneath the upper electrode wire and expose a portion of the lower electrode layer, in which the phase change material layer has an exposed side surface; after etching the phase change material, performing a nitridizing treatment on the side surface of the phase change material layer to form a nitridized phase change material layer covering the side surface of the phase change material layer; and etching the lower electrode layer, the selector material and the conductive layer according to the phase change material layer and the nitridized phase change material layer to form a lower electrode wire, a selector material layer and a conductive wire therebeneath.

In some embodiments, performing the nitridizing treatment on the side surface of the phase change material layer comprises performing the nitridizing treatment using a nitrogen-containing gas plasma.

In some embodiments, the nitrogen-containing gas plasma comprises nitrogen plasma, ammonia plasma, or a combination thereof.

In some embodiments, etching the phase change material according to the upper electrode wire comprises etching the phase change material using inductively coupled plasma (ICP), plasma ion sputtering or a combination thereof.

In some embodiments, the method further includes: before performing the nitridizing treatment on the side surface of the phase change material layer, side-etching the side surface of the phase change material layer, so that a width of the phase change material layer is smaller than a width of the upper electrode wire.

In some embodiments, side-etching the side surface of the phase change material layer comprises using an etchant.

In some embodiments, the method further includes: forming an isolation material layer laterally adjacent to the upper electrode wire, the phase change material layer, the nitridized phase change material layer, the lower electrode wire and the conductive wire; etching the upper electrode wire according to a second mask to form a plurality of upper electrode units; etching the phase change material layer according to the upper electrode units to form a plurality of phase change units beneath the upper electrode units, respectively; and etching the lower electrode wire according to the phase change units to form a plurality of lower electrode units beneath the phase change units, respectively.

In some embodiments, each of the phase change units has an exposed side surface, and the method further includes: after etching the phase change material layer, performing another nitridizing treatment on the side surface of each of the phase change units to form another nitridized phase change material layer covering the side surface of each of the phase change units.

In some embodiments, performing the other nitridizing treatment on the side surface of each of the phase change units comprises performing the other nitridizing treatment using a nitrogen-containing gas plasma.

In some embodiments, the method further includes: before performing the other nitridation treatment on the side surface of each of the phase change units, side-etching the side surface of each of the phase change units, so that a width of the phase change unit is smaller than a width of the upper electrode unit.

The present invention also provides a phase change memory, which includes a lower electrode unit, an upper electrode unit, a phase change unit, a nitridized phase change material layer and a selector. The upper electrode unit is disposed over the lower electrode unit. The phase change unit is disposed between the lower electrode unit and the upper electrode unit. The nitridized phase change material layer covers a side surface of the phase change unit. The selector is disposed beneath the lower electrode unit.

In some embodiments, a sum of a width of the phase change unit and a width of the nitridized phase change material layer is greater than a width of the upper electrode unit.

In some embodiments, a width of the phase change unit is smaller than a width of the upper electrode unit.

In some embodiments, a sum of a width of the phase change unit and a width of the nitridized phase change material layer is less than or equal to a width of the upper electrode unit.

It should be understood that the above general description and the following detailed description are exemplary and are intended to provide a further explanation of the claimed invention.

BRIEF DESCRIPTION OF THE DRAWINGS

The present invention can be more fully understood by reading the following detailed description of the embodiments and referring to the accompanying drawings.

DETAILED DESCRIPTION

In order that the present invention is described in detail and completeness, implementation aspects and specific embodiments of the present invention with illustrative description are presented, but it is not the only form for implementation or use of the specific embodiments of the present invention. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present invention may be practiced without these specific details.

Further, spatially relative terms, such as "beneath," "over," and the like, may be used herein for ease of description to describe one element or feature's relationship to another element(s) or feature(s) as shown in the figures. The true meaning of the spatially relative terms includes other orientations. For example, when the figure is flipped up and down by 180 degrees, the relationship between one component and another component may change from "beneath" to "over." The spatially relative descriptions used herein should be interpreted the same.

As described in the section of "Description of Related Art", the lithography and etching processes are commonly used to manufacture the phase change memory. However, the phase change material layer in the phase change memory is very vulnerable to subsequent etching processes and thus is seriously damaged. Therefore, how to prevent the phase change material layer from being seriously damaged during the subsequent etching processes has become an important issue in this technical field.

Accordingly, the present invention provides a method of manufacturing a phase change memory by forming a nitridized phase change material layer on an exposed surface of the phase change material layer that can protect the phase change material layer to prevent the phase change material layer from being seriously damaged during the subsequent etching processes. Various embodiments of the method of manufacturing the phase change memory will be described in detail below.

FIGS. 1, 2, 3, 4, 5A-5B, 6A-6B, 7, 8, 9, 10 are schematic diagrams of a method of manufacturing a phase change memory at various stages according to some embodiments of the present invention.

Figure 1:
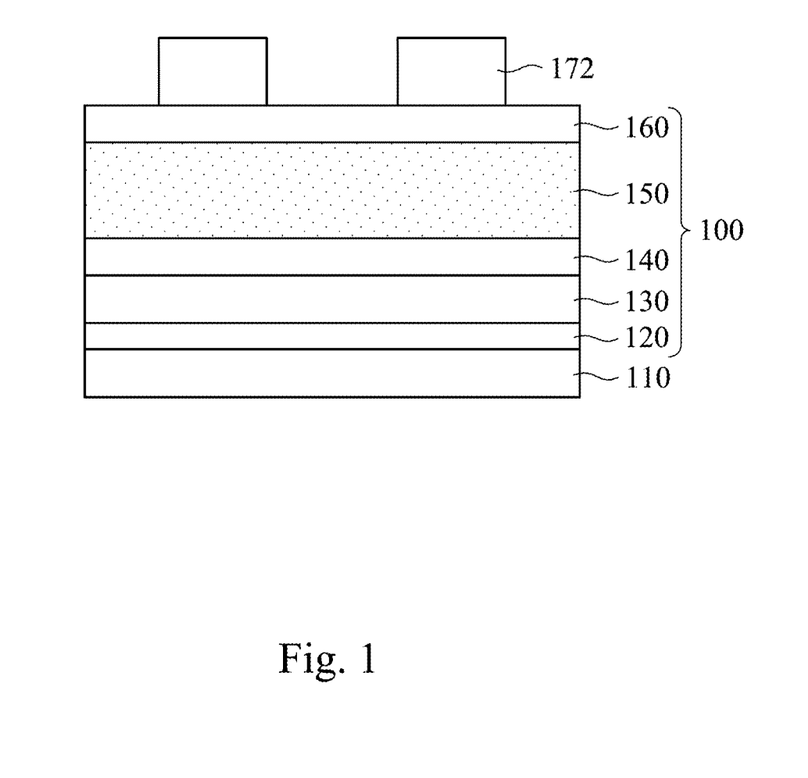
FIGS. 1, 2, 3, 4, 5A-5B, 6A-6B, 7, 8, 9, 10 are schematic diagrams of a method of manufacturing a phase change memory at various stages according to some embodiments of the present invention.

As shown in FIG. 1, a stacked structure 100 is formed, which includes a conductive layer 120, a lower electrode layer 140, an upper electrode layer 160, and a phase change material 150. In some embodiments, the stacked structure 100 is formed over a substrate 110. In some embodiments, the substrate 110 is a semiconductor substrate, such as a silicon substrate, but is not limited thereto, and other suitable materials may be used as the substrate 110, such as ceramic materials, organic materials, or glass materials.

In some embodiments, a material of the conductive layer 120 includes metallic materials, such as titanium, tantalum, tungsten, aluminum, copper, molybdenum, platinum, titanium nitride, tantalum nitride, tantalum carbide, tantalum silicon nitride, tungsten nitride, molybdenum nitride, molybdenum oxynitride, ruthenium oxide, titanium aluminum, titanium aluminum nitride, tantalum carbonitride, other suitable materials or a combination thereof. In some embodiments, the conductive layer 120 may be subsequently patterned to form a plurality of conductive wires parallel to each other, and these conductive wires may act as word lines or bit lines.

In some embodiments, the lower electrode layer 140 and the upper electrode layer 160 include metallic materials, such as tungsten, titanium, titanium nitride, tantalum nitride, aluminum titanium nitride, aluminum tantalum nitride, or a combination thereof.

In some embodiments, the phase change material 150 includes germanium antimony tellurium ($Ge_2Sb_2Te_5$, $Ge_3Sb_6Te_5$, GST), antimony telluride ($Sb_2Te$), antimony germanium (GeSb), indium-doped antimony telluride (In-doped $Sb_2Te$) or a combination thereof.

In some embodiments, the stacked structure 100 further includes a selector material 130 disposed between the conductive layer 120 and the lower electrode layer 140. In some embodiments, the selector material 130 includes a semiconductor material, such as silicon. In some embodiments, the selector material 130 includes a PN diode.

In some embodiments, the conductive layer 120, the selector material 130, the lower electrode layer 140, the phase change material 150, and the upper electrode layer 160 are blanket formed over the substrate 110 in sequence, as shown in FIG. 1.

Figure 2:
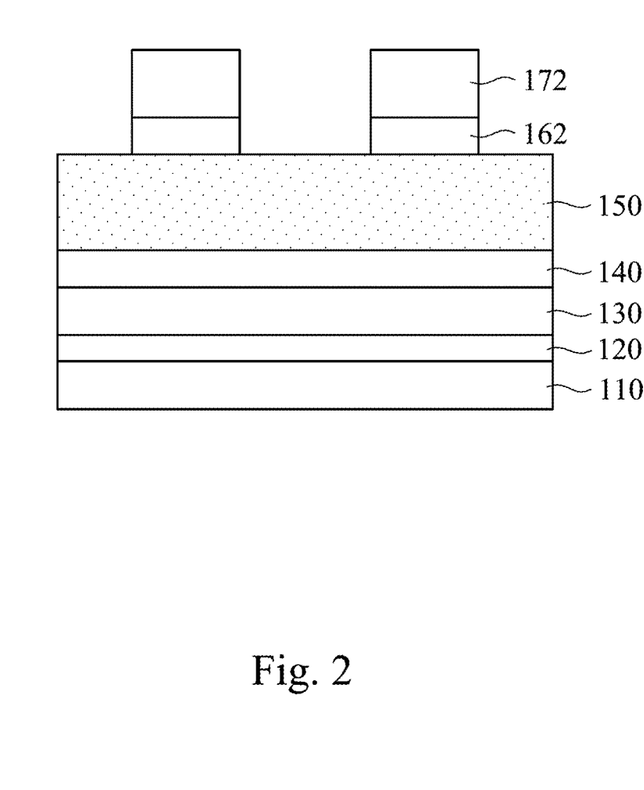

Subsequently, as shown in FIGS. 1 and 2, a first mask 172 is formed over the upper electrode layer 160 of the stacked structure 100, and the upper electrode layer 160 is then etched according to the first mask 172 to form a plurality of upper electrode wires 162. In some embodiments, the first mask 172 is, for example, a photoresist (PR) or a hard mask (HM). In some embodiments, the process of etching the upper electrode layer 160 is, for example, a dry etching process or a wet etching process. In some embodiments, the dry etching process for etching the upper electrode layer 160 is, for example, a plasma etching process using a gas including $Cl_2$, $BCl_3$, $SF_6$, or any combination thereof. In some embodiments, the wet etching process for etching the upper electrode layer 160 is, for example, a wet etching process using an etching solution including phosphoric acid, nitric acid, and acetic acid.

Figure 3:
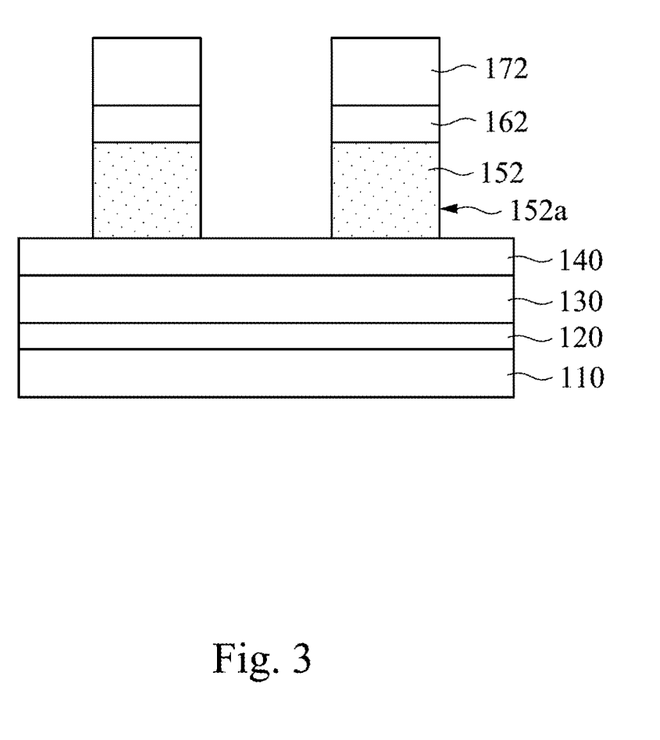

Next, as shown in FIGS. 2 and 3, the phase change material 150 is etched according to the upper electrode wire 162 to form a phase change material layer 152 beneath the upper electrode wire 162 and expose a portion of the lower electrode layer 140, in which the phase change material layer 152 has an exposed side surface 152a. In some embodiments, etching the phase change material 150 includes etching the phase change material 150 using inductively coupled plasma (ICP), plasma ion sputtering, or a combination thereof. In some embodiments, chlorine-based (Cl-based), fluorine-based (F-based) or bromine-based (Brbased) plasma and gas such as helium or argon are used in the inductively coupled plasma etching process.

Figure 4:
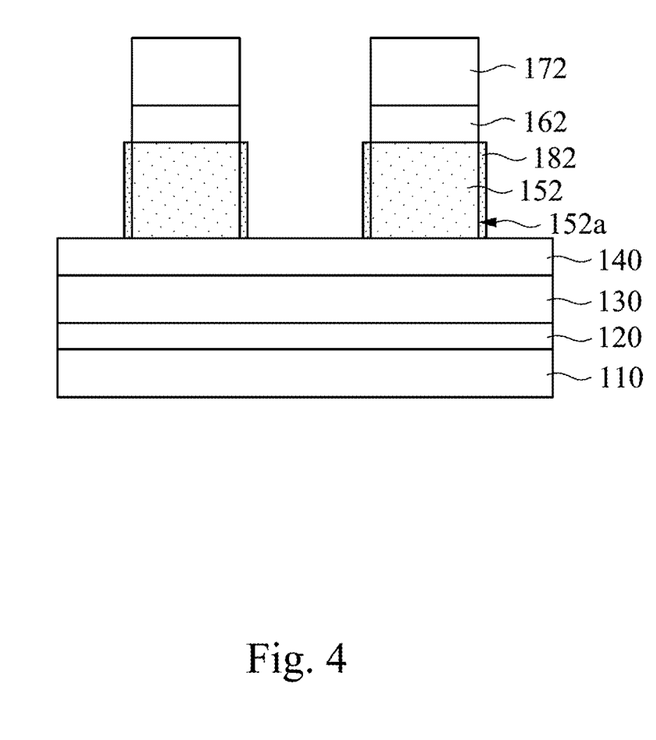

Next, as shown in FIGS. 3 and 4, a nitridizing treatment is performed on the side surface 152a of the phase change material layer 152 to form a nitridized phase change material layer 182 covering the side surface 152a of the phase change material layer 152. The nitridized phase change material layer 182 can effectively protect the phase change material layer 152 from damage during subsequent etching processes. In some embodiments, performing the nitridizing treatment on the side surface 152a of the phase change material layer 152 includes performing the nitridizing treatment on the side surface 152a of the phase change material layer 152 using a nitrogen-containing gas plasma. In some embodiments, the nitrogen-containing gas plasma includes nitrogen plasma, ammonia plasma, or a combination thereof. In some embodiments, a process temperature of the nitridizing treatment is in a range of from 200° C. to 400° C. In some embodiments, the nitridized phase change material layer 182 includes germanium antimony tellurium nitride, nitrogen-doped germanium antimony tellurium, antimony tellurium nitride, nitrogen-doped antimony tellurium, germanium antimony nitride, nitrogen-doped germanium antimony or a combination thereof.

Figure 5A:
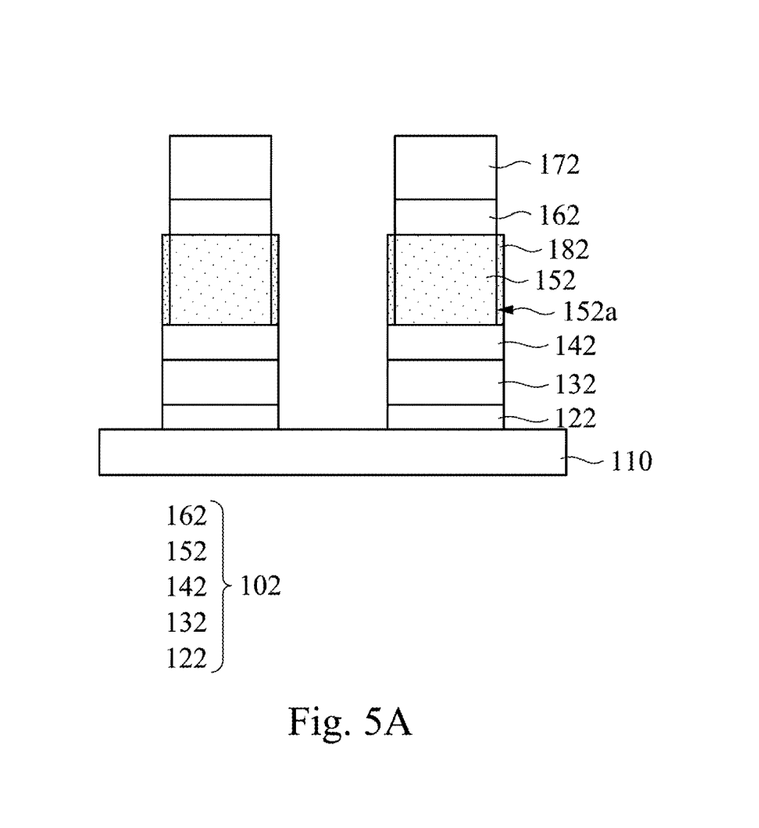

Next, as shown in FIGS. 4 and 5A, the lower electrode layer 140, the selector material 130, and the conductive layer 120 are etched according to the phase change material layer 152 and the nitridized phase change material layer 182 to form a lower electrode wire 142, a selector material layer 132 and a conductive wire 122 therebeneath. In some embodiments, the lower electrode layer 140, the selector material 130, and the conductive layer 120 are etched according to the phase change material layer 152 and the nitridized phase change material layer 182.

In some embodiments, the process for etching the lower electrode layer 140 is, for example, a dry etching process or a wet etching process. In some embodiments, the dry etching process for etching the lower electrode layer 140 is, for example, a plasma etching process using a gas including $Cl_2$, $BCl_3$, $SF_6$, or any combination thereof. In some embodiments, the wet etching process for etching the lower electrode layer 140 is, for example, a wet etching process using an etching solution including phosphoric acid, nitric acid, and acetic acid.

In some embodiments, the process of etching the selector material 130 to form the selector material layer 132 is to manufacture a PN diode with a vertical profile. Manufacturing the PN diode with the vertical profile is a known technique in this technical field, so the manufacturing process thereof is not repeated here.

In some embodiments, the process of etching the conductive layer 120 is, for example, a dry etching process or a wet etching process. In some embodiments, the dry etching process for etching the conductive layer 120 is, for example, a plasma etching process using a gas including $Cl_2$, $BCl_3$, $SF_6$, or any combination thereof. In some embodiments, the wet etching process for etching the conductive layer 120 is, for example, a wet etching process using an etching solution including phosphoric acid, nitric acid, and acetic acid.

In some embodiments, certain chemicals used in the processes of etching the lower electrode layer 140, the selector material 130, and the conductive layer 120 may cause severe damage to the phase change material layer 152. For example, the etching gas or etching liquid used in the subsequent etching of the lower electrode layer 140, the selector material 130, and the conductive layer 120 will damage the surface of the phase change material layer 152 and cause defects, so that the structural states of the crystalline phase and the amorphous phase of the phase change material layer 152 and the resistance values thereof have been different from those before the damage. Therefore, although the phase change material layer 152 can still be switched between the crystalline phase and the amorphous phase, the change of resistance value before and after the conversion will deviate from the originally predetermined change of resistance value. However, in the present invention, the nitridized phase change material layer 182 formed covering the side surface 152a of the phase change material layer 152 can protect the phase change material layer 152 from these chemicals during subsequent etching processes and ensure that the resistance states (e.g., high resistance and low resistance) of the phase change material layer 152 used to store information are not affected, thereby improving the performance of the memory element.

Figure 5B:
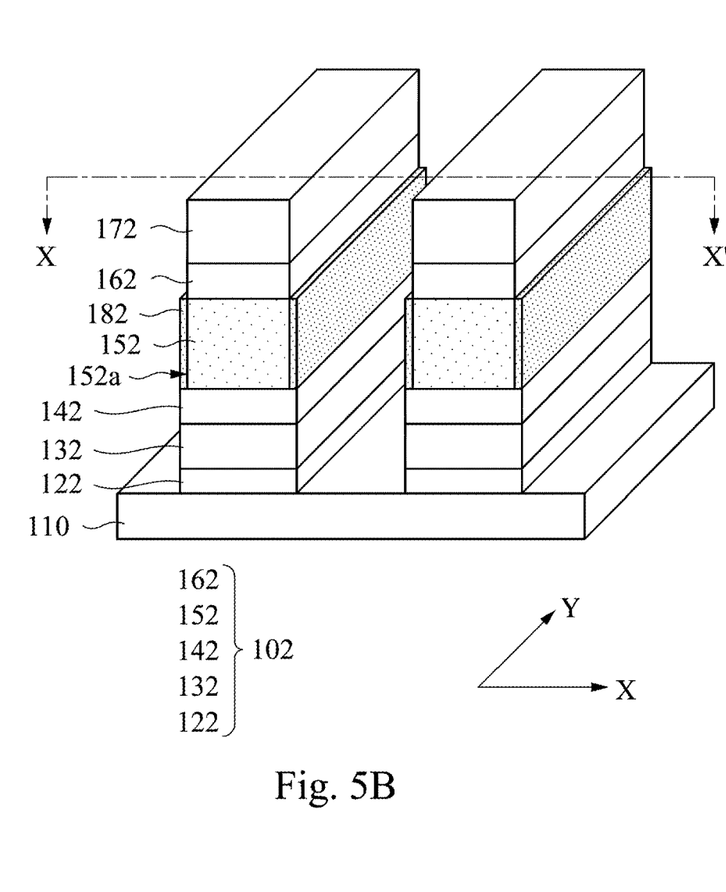

FIG. 5A is a cross-sectional view taken along line X-X' of FIG. 5B according to some embodiments of the present invention. In some embodiments, as shown in FIG. 5B, the conductive wire 122, the selector material layer 132, the lower electrode wire 142, the phase change material layer 152, and the upper electrode wire 162 extend along the Y direction. As shown in FIGS. 5A and 5B, the conductive wire 122, the selector material layer 132, the lower electrode wire 142, the phase change material layer 152, and the upper electrode wire 162 constitute a stacked structure 102.

Figure 6A:
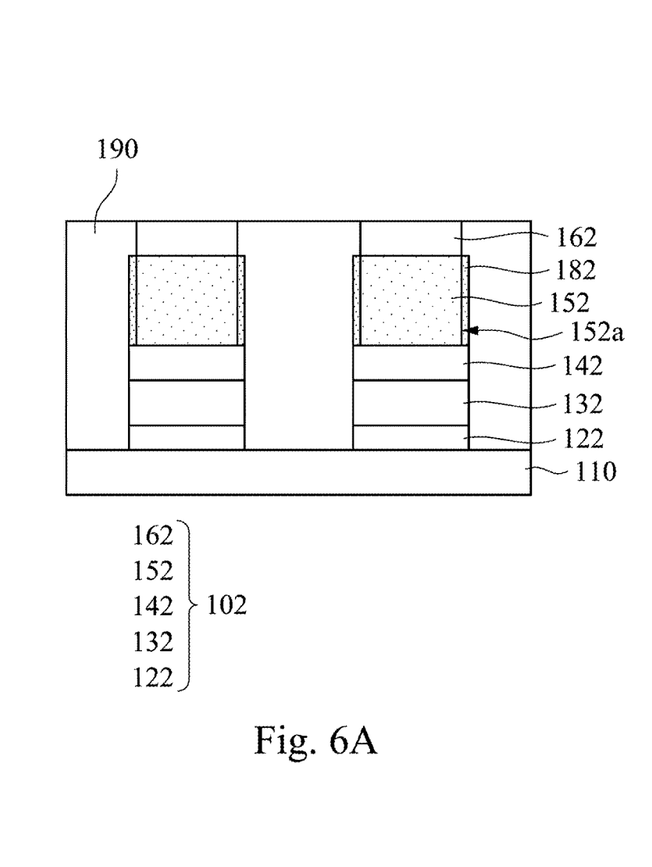
Figure 6B:
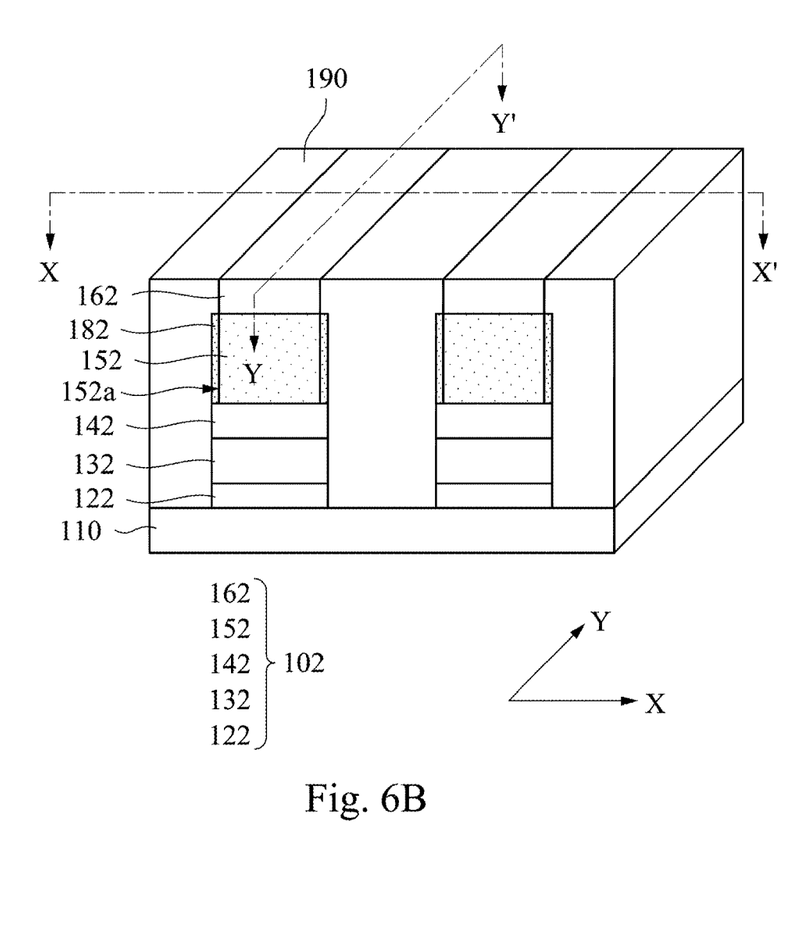

Subsequently, as shown in FIGS. 5A and 6A (or FIGS. 5B and 6B), an isolation material layer 190 is formed laterally adjacent to the upper electrode wire 162, the phase change material layer 152, the nitridized phase change material layer 182, the lower electrode wire 142, the selector material layer 132 and the conductive wire 122. More specifically, in some embodiments, an isolation material is deposited over the first mask 172 and the stacked structure 102 and between the stacked structures 102 shown in FIG. 5B, and a polishing process (e.g., a chemical mechanical polishing process) is performed to remove the first mask 172 and excess isolation material, so that a top surface of the isolation material layer 190 after polishing is coplanar with a top surface of the upper electrode wire 162, as shown in FIG. 6B. In some embodiments, the isolation material includes oxide, nitride, oxynitride, or a combination thereof, such as silicon oxide, silicon nitride, silicon oxynitride, or a combination thereof. In some embodiments, a chemical vapor deposition process may be used to deposit the isolation material.

FIG. 6A is a cross-sectional view taken along line X-X' of FIG. 6B according to some embodiments of the present invention. In some embodiments, as shown in FIG. 6B, the isolation material layer 190 is filled between the two stacked structures 102.

Figure 7:
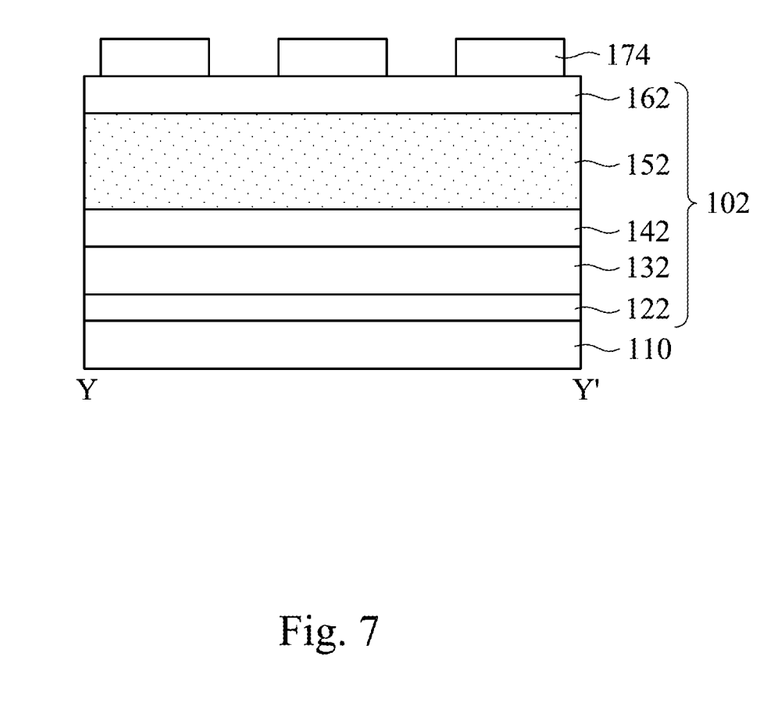

FIG. 7 is a cross-sectional view taken along line Y-Y' of FIG. 6B according to some embodiments of the present invention. As shown in FIGS. 6B and 7, after the isolation material layer 190 is formed, a second mask 174 is formed over the upper electrode wire 162 of the stacked structure 102. In some embodiments, the second mask 174 is, for example, a photoresist or a hard mask.

Figure 8:
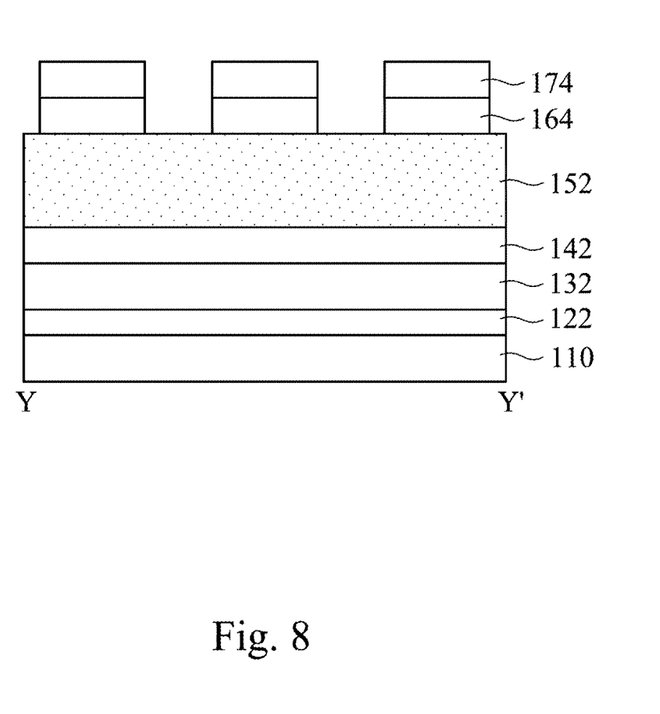

Next, as shown in FIGS. 7 and 8, the upper electrode wire 162 is etched according to the second mask 174 to form a plurality of upper electrode units 164. In some embodiments, the process of etching the upper electrode wire 162 may be the same as the process of etching the upper electrode layer 160, so description thereof is not repeated here.

Figure 9:
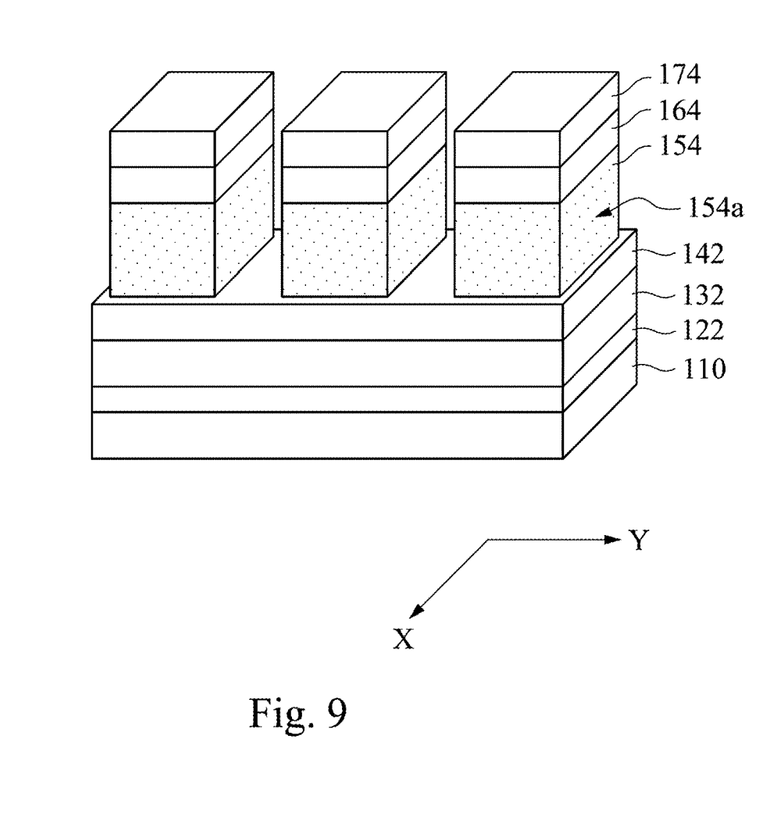

Subsequently, as shown in FIGS. 8 and 9, the phase change material layer 152 is etched according to the upper electrode units 164 to form a plurality of phase change units 154 beneath the upper electrode units 164, respectively. In some embodiments, etching the phase change material layer 152 includes etching the phase change material layer 152 using inductively coupled plasma, plasma ion sputtering, or a combination thereof. These processes can also etch the nitridized phase change material layer 182 (not shown in FIG. 8, refer to the nitridized phase change material layer 182 in FIG. 6B) not covered by the second mask 174 and the upper electrode unit 164. In addition, the inventor found that the etching rate of the phase change material layer 152 is about equal to that of the nitridized phase change material layer 182. In some embodiments, as shown in FIGS. 8 and 9, the phase change unit 154 formed after the phase change material layer 152 and the nitridized phase change material layer 182 are etched according to the upper electrode unit 164 has a plurality of exposed side surfaces 154a.

Figure 10:
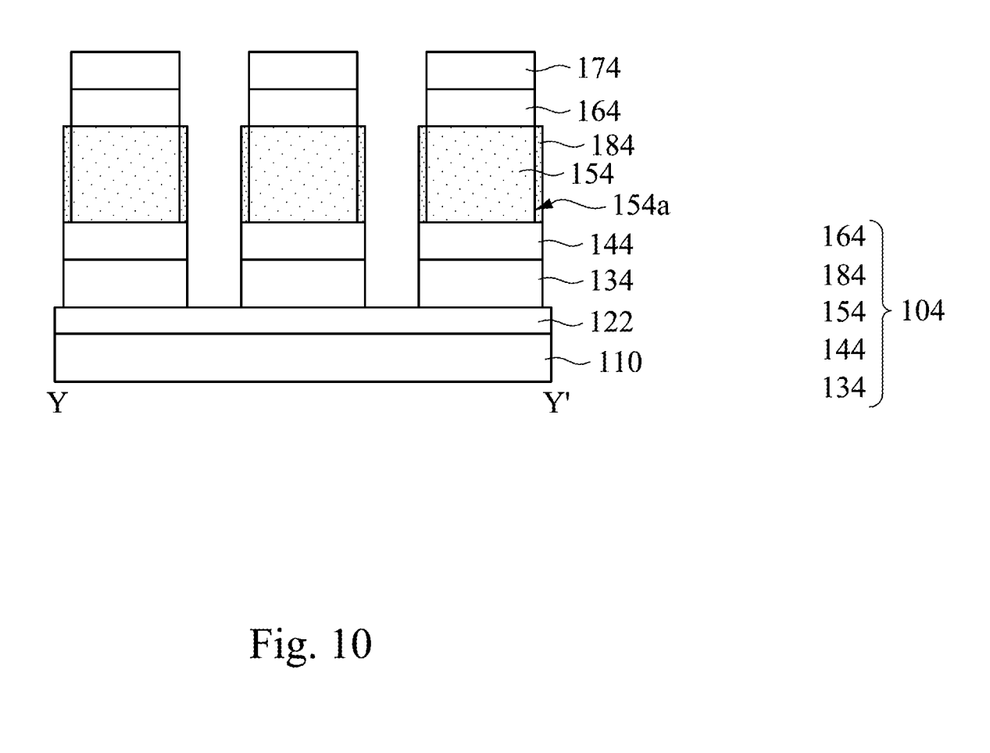

As shown in FIGS. 9 and 10, another nitridizing treatment is performed on the side surface 154a of each of the phase change units 154 to form another nitridized phase change material layer 184 covering the side surface 154a of each of the phase change units 154. In some embodiments, the nitridizing treatment includes using a nitrogen-containing gas plasma, which includes nitrogen plasma, ammonia plasma, or a combination thereof. In some embodiments, a process temperature of the nitridizing treatment is in a range of from 200° C. to 400° C. In some embodiments, the nitridized phase change material layer 184 includes germanium antimony tellurium nitride, nitrogen-doped germanium antimony tellurium, antimony tellurium nitride, nitrogen-doped antimony tellurium, germanium antimony nitride, nitrogen-doped germanium antimony or a combination thereof.

Next, still referring to FIGS. 9 and 10, after the nitridized phase change material layer 184 is formed, the lower electrode wire 142 and the selector material layer 132 are etched according to the plurality of phase change units 154 to form a plurality of lower electrodes units 144 and a plurality of selectors 134 therebeneath. In some embodiments, the lower electrode wire 142 and the selector material layer 132 are etched according to the phase change units 154 and the nitridized phase change material layer 184. In some embodiments, the processes of etching the lower electrode wire 142 and the selector material layer 132 may be the same as the processes of etching the lower electrode layer 140 and the selector material 130, so description thereof are not repeated here.

In some embodiments, certain chemicals used in the process of etching the lower electrode wire 142 and the selector material layer 132 may cause severe damage to the phase change unit 154. For example, the etching gas or etching liquid used in the subsequent etching of the lower electrode wire 142 and the selector material layer 132 will damage the surface of the phase change unit 154 and cause defects, so that the structural states of the crystalline phase and the amorphous phase of the phase change unit 154 and the resistance values thereof have been different from those before the damage. Therefore, although the phase change unit 154 can still be switched between the crystalline phase and the amorphous phase, the change of resistance value before and after the conversion will deviate from the originally predetermined change of resistance value. However, in the present invention, the nitridized phase change material layer 184 formed covering the side surface 154a of the phase change unit 154 can protect the phase change unit 154 from these chemicals during subsequent etching processes and ensure that the resistance states (e.g., high resistance and low resistance) of the phase change unit 154 used to store information are not affected, thereby improving the performance of the memory element.

In some embodiments, the selector 134, the lower electrode unit 144, the phase change unit 154, and the upper electrode unit 164 constitute a memory cell 104. In some embodiments, an another conductive wire is formed over the memory cell 104. Viewed from above, the other conductive wire and the conductive wire 122 are perpendicularly crossed with each other, and the other conductive wire and the conductive wire 122 can as act as a word line and a bit line, respectively.

Figure 11:
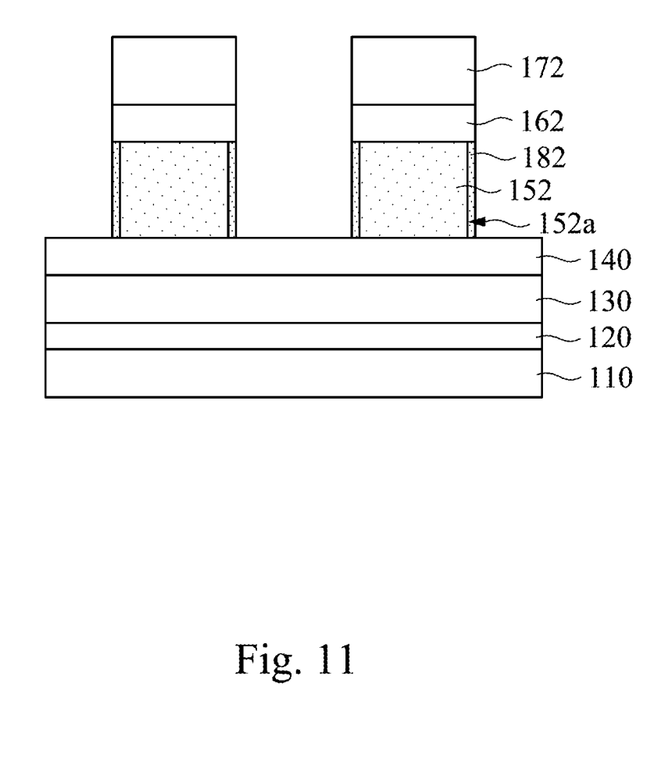
FIG. 11 is a schematic diagram of a method of manufacturing a phase change memory at a certain stage according to some embodiments of the present invention.

FIG. 11 is a schematic diagram of a method of manufacturing a phase change memory at a certain stage according to some embodiments of the present invention. In addition to the above operations, the method of manufacturing the phase change memory may optionally further include the operation shown in FIG. 11, which are described in detail below. As shown in FIGS. 3 and 11, before the nitridizing treatment is performed on the side surface 152a of the phase change material layer 152, the side surface 152a may be side-etched, and the nitridizing treatment is then performed on the side surface 152a to form a nitridized phase change material layer 182 covering the side surface 152a of the phase change material layer 152. The side-etching makes the phase change material layer 152 shrink inward in the lateral direction; preferably, it further makes a sum of a width of the phase change material layer 152 and a width of the nitridized phase change material layer 182 does not protrude outward beyond the width of the upper electrode wire 162 in the lateral X direction (as shown in FIG. 11), so the nitridized phase change material layer 182 does not protrude outward in the lateral direction. See the difference between FIG. 4 without side-etching and FIG. 11 with side-etching. After the side-etching, the width of the phase change material layer 152 becomes narrower (as shown in FIG. 11), and the sum of the width of the phase change material layer 152 and the width of the nitridized phase change material layer 182 does not protrude outward beyond the width of the upper electrode wire 162 in the lateral X direction.

Figure 12:
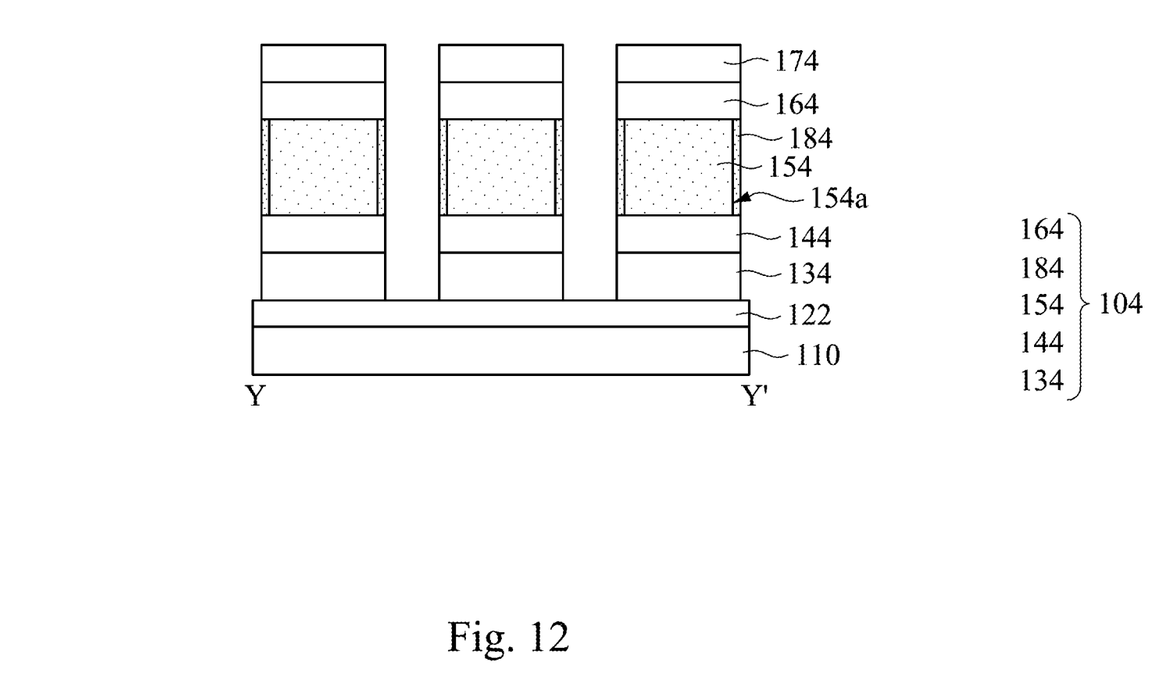
FIG. 12 is a schematic diagram of a method of manufacturing a phase change memory at a certain stage according to some embodiments of the present invention.

FIG. 12 is a schematic diagram of a method of manufacturing a phase change memory at a certain stage according to some embodiments of the present invention. Similarly, as shown in FIG. 9, before the nitridizing treatment is performed on the side surface 154a of each of the phase change units 154, the side surface 154a may also be side-etched, and the nitridizing treatment is then performed on the side surface 154a to form another nitridized phase change material layer 184 covering the side surface 154a of each of the phase change units 154, as shown in FIG. 12. The side-etching makes the phase change unit 154 shrink inward in the lateral direction; preferably, it further makes a sum of a width of the phase change unit 154 and a width of the nitridized phase change material layer 184 does not protrude outward beyond the width of the upper electrode unit 164 in the lateral Y direction, so the nitridized phase change material layer 184 does not protrude outward in the lateral direction.

After the two side-etching processes, the widths of the phase change unit 154 in the X direction and the Y direction both become narrower and smaller than the width of the upper electrode unit 164; preferably, the sum of the width of the phase change unit 154 and the width of the nitridized phase change material layer 182/184 does not protrude outward beyond the width of the upper electrode unit 164 in the lateral X/Y direction. Therefore, the distance between the two adjacent memory cells 104 can be further reduced, which helps to increase density of the memory cells 104 formed over the substrate 110. In some embodiments, side-etching the side surface 152a and side-etching the side surface 154a can be achieved by a wet etching process using an etching solution.

The present invention also provides a phase change memory. Referring to FIG. 10, the phase change memory 104 includes a lower electrode unit 144, an upper electrode unit 164, a phase change unit 154, a nitridized phase change material layer 184, and a selector 134.

The upper electrode unit 164 is disposed over the lower electrode unit 144. The upper electrode unit 164 is substantially aligned with or aligned with the lower electrode unit 144.

The phase change unit 154 is disposed between the lower electrode unit 144 and the upper electrode unit 164. The phase change unit 154 is substantially aligned with or aligned with the lower electrode unit 144 and the upper electrode unit 164.

The selector 134 is disposed beneath the lower electrode unit 144. The selector 134 is substantially aligned or aligned with the lower electrode unit 144. The selector 134 is disposed between the conductive wire 122 and the lower electrode unit 144.

The nitridized phase change material layer 184 covers a side surface 154a of the phase change unit 154. In some embodiments, referring to FIGS. 9 and 10, from a stereoscopic perspective, the nitridized phase change material layer 184 covers four side surfaces 154 a (i.e., all side surfaces 154a) of the phase change unit 154.

In some embodiments, as shown in FIG. 10, a width of the phase change unit 154 is substantially the same as or the same as a width of the upper electrode unit 164. In some embodiments, as shown in FIG. 10, a sum of the width of the phase change unit 154 and a width of the nitridized phase change material layer 184 is greater than the width of the upper electrode unit 164.

In some embodiments, as shown in FIG. 12, a width of the phase change unit 154 is smaller than a width of the upper electrode unit 164. In some embodiments, as shown in FIG. 12, a sum of the width of the phase change unit 154 and a width of the nitridized phase change material layer 184 is less than or equal to the width of the upper electrode unit 164.

Although embodiments of the present invention have been described in considerable detail, other embodiments are possible. Therefore, the spirit and scope of the claim scope of the present invention should not be limited to the description of the embodiments contained herein.

It is obvious to those skilled in the art that various modifications and changes can be made to the structure of the present invention without departing from the scope or spirit of the present invention. In view of the foregoing, the present invention is intended to cover the modifications and changes of the present invention as long as they fall within the claim scope of the present invention.

What is claimed is:

1. A method of manufacturing a phase change memory, comprising:
    forming a stacked structure, the stacked structure comprising:
        a conductive layer;
        a lower electrode layer disposed over the conductive layer;
        an upper electrode layer disposed over the lower electrode layer;
        a phase change material disposed between the lower electrode layer and the upper electrode layer; and
        a selector material disposed between the conductive layer and the lower electrode layer;
    etching the upper electrode layer according to a first mask to form an upper electrode wire;
    etching the phase change material according to the upper electrode wire to form a phase change material layer beneath the upper electrode wire and expose a portion of the lower electrode layer, wherein the phase change material layer has an exposed side surface;
    after etching the phase change material, performing a nitridizing treatment on the side surface of the phase change material layer to form a nitridized phase change material layer covering the side surface of the phase change material layer; and
    etching the lower electrode layer, the selector material and the conductive layer according to the phase change material layer and the nitridized phase change material layer to form a lower electrode wire, a selector material layer and a conductive wire therebeneath.

2. The method of claim 1, wherein performing the nitridizing treatment on the side surface of the phase change material layer comprises performing the nitridizing treatment using a nitrogen-containing gas plasma.

3. The method of claim 2, wherein the nitrogen-containing gas plasma comprises nitrogen plasma, ammonia plasma, or a combination thereof.

4. The method of claim 1, wherein etching the phase change material according to the upper electrode wire comprises etching the phase change material using inductively coupled plasma (ICP), plasma ion sputtering or a combination thereof.

5. The method of claim 1, further comprising:
    before performing the nitridizing treatment on the side surface of the phase change material layer, side-etching the side surface of the phase change material layer, so that a width of the phase change material layer is smaller than a width of the upper electrode wire.

6. The method of claim 5, wherein side-etching the side surface of the phase change material layer comprises using an etchant.

7. The method of claim 1, further comprising:
    forming an isolation material layer laterally adjacent to the upper electrode wire, the phase change material layer, the nitridized phase change material layer, the lower electrode wire and the conductive wire;
    etching the upper electrode wire according to a second mask to form a plurality of upper electrode units;
    etching the phase change material layer according to the upper electrode units to form a plurality of phase change units beneath the upper electrode units, respectively; and
    etching the lower electrode wire according to the phase change units to form a plurality of lower electrode units beneath the phase change units, respectively.

8. The method of claim 7, wherein each of the phase change units has an exposed side surface, and the method further comprises:
    after etching the phase change material layer, performing another nitridizing treatment on the side surface of each of the phase change units to form another nitridized phase change material layer covering the side surface of each of the phase change units.

9. The method of claim 8, wherein performing the other nitridizing treatment on the side surface of each of the phase change units comprises performing the other nitridizing treatment using a nitrogen-containing gas plasma.

10. The method of claim 9, further comprising:

before performing the other nitridation treatment on the side surface of each of the phase change units, side-etching the side surface of each of the phase change units, so that a width of the phase change unit is smaller than a width of the upper electrode unit.

\* \* \* \* \*